United States Patent [19]

Lancaster et al.

[11] Patent Number: 5,760,644
[45] Date of Patent: Jun. 2, 1998

[54] INTEGRATED CIRCUIT TIMER FUNCTION USING NATURAL DECAY OF CHARGE STORED IN A DIELECTRIC

[75] Inventors: Loren T. Lancaster; Ryan T. Hirose, both of Colorado Springs, Colo.

[73] Assignee: NVX Corporation, Colorado Springs, Colo.

[21] Appl. No.: 735,973

[22] Filed: Oct. 25, 1996

Related U.S. Application Data

[60] Provisional application No. 60/007,062, Oct. 25, 1995.

[51] Int. Cl.$^6$ .................................................. H01L 25/00
[52] U.S. Cl. ........................ 327/566; 327/78; 327/134
[58] Field of Search ............................... 327/7, 77, 78, 327/131, 134, 565–6; 257/324

[56] References Cited

U.S. PATENT DOCUMENTS

| | | | |
|---|---|---|---|
| 4,701,868 | 10/1987 | Stokes et al. | 364/483 |
| 5,283,764 | 2/1994 | Kim et al. | 365/222 |
| 5,287,319 | 2/1994 | Fukumoto | 365/222 |
| 5,424,569 | 6/1995 | Prall | 257/324 |
| 5,485,429 | 1/1996 | Ono | 365/222 |
| 5,511,020 | 4/1996 | Hu et al. | 365/185.28 |

OTHER PUBLICATIONS

Christer Svensson and Ingemark Lundstrom, *Trap–assisted Charge Injection in MNOS Structures*, Oct. 1973, J. Appl. Phys., vol. 44, No. 10.

K. Ingemark Lundstrom and Christer M. Svensson, *Properties of MNOS Structures*, Jun. 1972, IEEE Transactions on Electron Devices, vol. Ed–19, No. 6.

Yoshihiro Takahashi and Kazunori Ohnishi, *Estimation of Insulation Layer Conductrance in MNOS Structure* Nov. 1993, IEEE Transactions on Electron Devices, vol. 40, No. 11.

*Primary Examiner*—Margaret Rose Wambach
*Attorney, Agent, or Firm*—Richard A. Bachand

[57] ABSTRACT

A semiconductor integrated circuit to determine a passage of time that may include a time during which no electrical power is supplied to the circuit is disclosed. The circuit has a timing device that includes a memory storage dielectric material for trapping charge carriers and releasing the trapped charge carriers in a known manner over time. The timing device has an electrical parameter that is relatable to an electric field created by the trapped charge carriers. A charge injection circuit is provided for selectively injecting charge carriers into the memory storage dielectric material to create an initialized state, and a time reader circuit determines when the electrical parameter has reached a predetermined value that corresponds to a passage of a predetermined time. Preferably the timing device is an insulated gate field effect transistor in which the memory storage dielectric material is a dielectric material, such as SONOS or SNOS, between the gate and channel overlying at least the channel area.

22 Claims, 5 Drawing Sheets

INTEGRATED CIRCUIT TIMER FUNCTION USING NATURAL DECAY OF CHARGE STORED IN A DIELECTRIC

CROSS REFERENCE TO RELATED APPLICATIONS

This application is related to copending U.S. Provisional patent application Ser. No. 60/007,062 filed Oct. 25, 1995, to which reference is hereby expressly made, and which is incorporated herein in its entirety, by reference.

BACKGROUND OF THE INVENTION

1. Field of The Invention

This invention relates to improvements in semiconductor timer and clock circuits and, more particularly, to improvements in semiconductor timer and clock circuits that operate in ultra low power or no power applications.

2. Related Information

It is desirable to have a timer and/or clock function that can operate without the need of power. It is difficult, if not impossible, to guarantee that power will always be present to operate timers or clocks in contemporary electrical systems. In addition, it is often desirable to ensure that electrical systems are powered down or turned off when they are not actively in use, to minimize power consumption. However, this is not possible if the system must maintain a real time clock or timer.

Currently, this problem is typically solved by incorporating a dedicated battery that powers the real time timer or clock when the overall electrical system is powered down or off. In addition, the timer/clock circuitry is generally designed to operate at low power levels to ensure long battery life. However, relying on a battery is not practical in some systems where the timer must be active even when the battery dies or is removed. Such is the case, for example, where the timer or clock is set to indicate when a prepurchased amount of utilization time has elapsed, as with annually purchased software licenses or with prepurchased time on portable telecommunications equipment.

In some applications in which elements change or decay with time, actions may be required to be taken after specific periods of real time to prevent catastrophic loss. If power is removed from such systems, it may be important to know how much time has lapsed when power is restored. Thus, there is great motivation to provide a general purpose timer/clock function that requires no power to record the elapsed real time.

SUMMARY OF THE INVENTION

In light of the above, therefore, it is an object of the invention to provide an improved semiconductor timer and clock device that consumes less energy, compared to prior devices.

It is another object of the invention to provide an improved semiconductor timer and clock device that can record the passage of real time without an external power source.

Another object of the invention is to provide an improved semiconductor timer and clock device that can record the passage of time over long periods of time without the use of a large capacitor to provide energy.

Yet another object of the invention is to provide an improved semiconductor timer and clock device that can be placed entirely within an integrated circuit without requiring an external power source or an external timing element to record elapsed time.

It is further an object of the invention to provide an improved semiconductor timer and clock device that records the passage of time in an energy efficient manner without regard to the power consumed by the circuitry required to determine the amount of elapsed time.

It is yet another object of the invention to provide an improved semiconductor timer device that can be electrically accelerated or decelerated while biased.

The above and further objects, features, and advantages of the invention will become apparent from the detailed description of the preferred embodiments presented hereinafter, when read in conjunction with the accompanying drawings.

Thus, according to a preferred embodiment of the invention, a general purpose timer/clock integrated circuit is presented that does not require a power source to record the passage of time. The timer/clock integrated circuit can be constructed as a stand-alone unit, or preferably embedded in an integrated circuit where additional circuitry can augment the functionality of the invention, or the invention can augment the functionality of other circuitry. For example, with the addition of non-volatile registers and computational circuits, a real time clock calendar can be constructed. Or when embedded in a memory, the timer can be used to trigger a refresh operation whenever power is available.

The timing element is embedded in the integrated circuit and implemented by using the natural decay of charge trapped in a dielectric. Once charge is trapped, the electric field caused by the trapped charge can be measured at any later time. Since the electric field caused by the trapped charge is proportional to the amount of trapped charge, the measure of the electric field as a function of time indirectly measures the migration of the trapped charge, either within or out of the dielectric.

Since the migration of charge is predictable, a clock/timer function can be implemented by first trapping a predetermined amount of charge in the dielectric, and then later measuring, either directly or indirectly, the electric field caused by the trapped charge. Since the charge migration occurs naturally without the need of externally provided energy, no energy supply is required between when the charge is trapped and when the electric field is measured to record the elapsed time. Since the charge migration and charge loss occurs over a long period of time (typically years), a long term timer/clock can be implemented at very little cost, integrated circuit chip area, or energy. The charge loss period of time is a design parameter which can be varied depending on the application.

According to a preferred embodiment of the invention, a memory storage dielectric material is provided which is capable of trapping charge quickly and then releasing the charge slowly over time in a predictable manner. The timing element includes an insulated gate field effect transistor, which serves as a timer transistor. The timer transistor has a conductive gate, a source, a drain, a body, a channel region, and a dielectric between the gate and channel spanning at least the channel area that includes the memory storage dielectric material. A charge injection circuit capable of performing a reset operation applies biases to the gate, source, drain and body of the timer transistor in a manner that injects charge into the memory storage dielectric upon receiving a reset signal. A reference circuit is provided that is capable of producing a predetermined voltage or current reference at a level that can be either set by design or externally controlled. A time reader circuit is also provided that has at least circuitry capable of biasing the gate. source. drain and body of the timer transistor to produce a voltage or current that depends on the amount of charge stored in the memory storage dielectric. Comparator circuitry compares the charge dependent voltage or current produced when the timer transistor is biased to the reference value. and a latch circuit produces and stores a logical value that indicates a change in polarity in the difference between the reference value and the value from the timer transistor.

BRIEF DESCRIPTION OF THE DRAWINGS

The invention is illustrated in the accompanying drawings. in which.

In the various figures of the drawing. like reference numbers are used to denote like or similar parts.

DETAILED DESCRIPTION OF THE PREFERRED EMBODIMENTS

Figure 1:
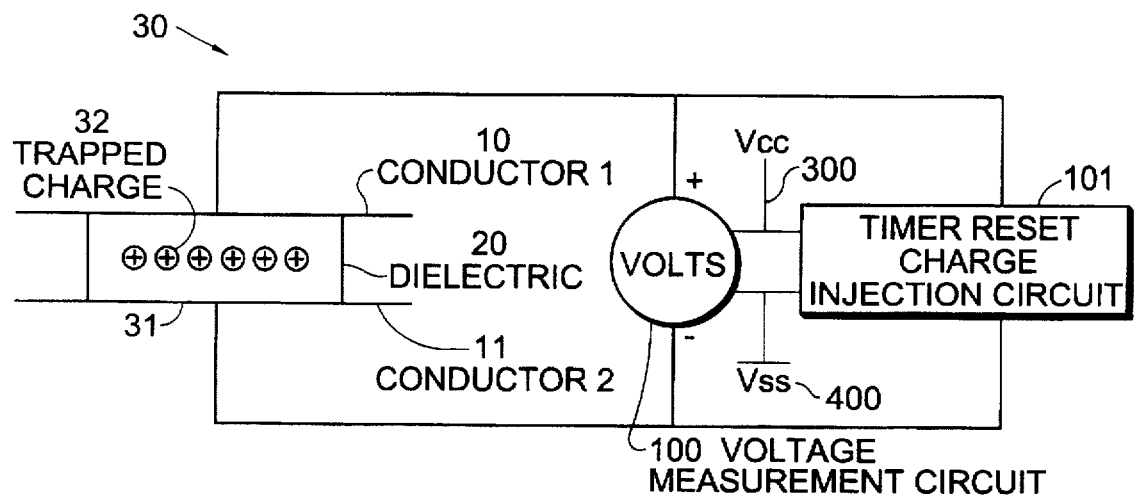
FIG. 1 is an electrical schematic diagram and capacitor representation of a dielectric storage timer and time measurement device. according to a preferred embodiment of the invention.

A timer 30 together with the required basic circuitry. according to a preferred embodiment of the invention. is shown in FIG. 1. The timer 30 includes a dielectric 20 between two conductors or plates 10 and 11 in which charge 32 is trapped or stored. The top and bottom plates 10 and 20 are connected to a voltage measurement circuit 100 and to a charge injection circuit 101.

In operation. the voltage generated by the field created by the stored charge 32 is measured between the first conductor 10 and the second conductor 11. The voltage measurement circuit 100 is powered by power supply voltages $V_{cc}$ and $V_{ss}$ applied to nodes 300 and 400. respectively; however. these voltages only need to be applied when the elapsed time is to be measured. The charge injection circuit 101 is also powered by $V_{cc}$ and $V_{ss}$ to reset the timer by injecting charge into the dielectric; however. it also needs to be powered only when the timer/clock is reset.

Figure 2:
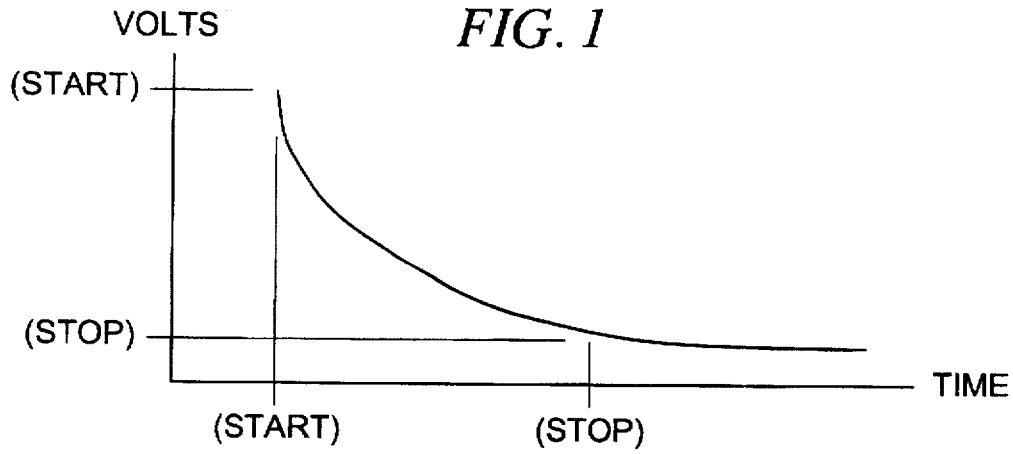
FIG. 2 is a typical plot of voltage created by charge trapped in a dielectric as measured by the circuit shown in FIG. 1 as a function of time. according to a preferred embodiment of the invention.

The measured voltage will vary as a function of time. as shown in FIG. 2. The start time is some point in time shortly after charge is injected into the memory dielectric. At the start time. the measured voltage is equal to the start voltage. The stop time is the time at which the measured voltage falls to the stop voltage. Since the rate at which the voltage falls with time is a highly predictable monotonic function. simply knowing the start and stop voltages is sufficient to indicate the elapsed time. In this way a timer and/or clock function is implemented.

Although the circuit in FIG. 1 looks similar to a capacitor decay circuit. it is quite different in that charge 32 is not being stored on a capacitor plate and there is no resistor element to control the discharge rate. Further. the trapped charge method described here is substantially better than using the RC decay of charge stored on a capacitor. since a very large capacitor would be required to store enough charge to last years. Such a large capacitor is not practical to implement in integrated circuits where low voltages (<20 volts) are desirable and the cost of the product is a strong function of the area of the product.

Figure 3:
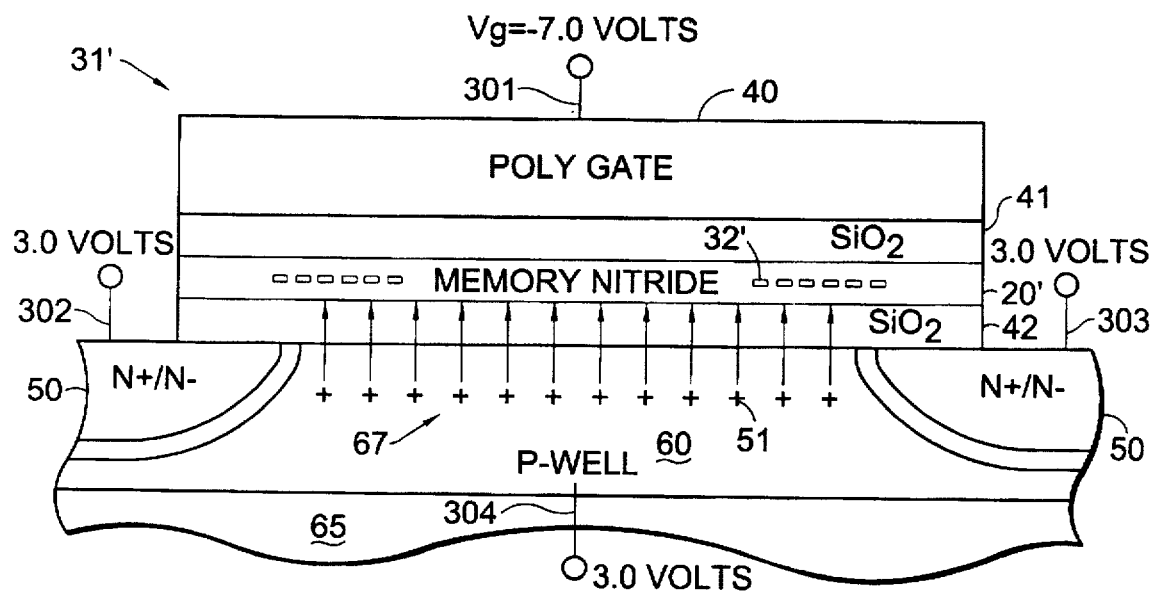
FIG. 3 is a structural representation of a SONOS device embodiment of a dielectric timing element under bias for injecting positive charge into the memory dielectric storage material. according to a preferred embodiment of the invention.

One embodiment of a timing element according to the invention is shown in FIG. 3. The timer uses a SONOS transistor 31' in which charge can be injected into a layer of silicon nitride. and the electric field caused by the trapped charge can be measured by its influence on the surface potential of the transistor channel region. As mentioned. the transistor 31' may alternatively use a SNOS dielectric layer. not shown. The transistor 31' has a polysilicon gate 40 with N+/N− source and drain regions 50 residing within a P-well 60 in a semiconductor substrate 65. In this embodiment. an n-channel device is utilized making the P-well region p-type and the source drain regions n-type; however. a p-channel device could alternatively be used. The gate dielectric has three layers with a layer of silicon nitride 20' in the middle. a first layer 41 of silicon dioxide on the top. and a second layer 42 of silicon dioxide on the bottom. The channel region 67 is bounded by the P-well 60 beneath bottom oxide 42 and the source and drain regions 50, and contains charge carriers 51.

The primary purpose of the nitride 20' is for trapping the charge. The primary function of the bottom oxide 42 is to provide a means of controlling the charge injection when an electric field is applied. The top oxide 41 is optional. but is particularly useful when the thickness of the nitride layer 20' is less than 200 Angstroms. The top oxide layer 41 is used to block charge injection from the gate 40.

Typically. the applied voltages are such that −10 volts is applied between the gate 40 and the channel 67. which causes the nitride layer to become positively charged. More specifically. −7 volts may be applied to node 301 which is connected to the gate 40. and +3 volts may be applied to nodes 302. 303. and 304. which are connected to the source. drain. and p-well components of device 31'. This bias creates a negative field that causes positively charged holes 51 to accumulate at the surface of the channel. The holes 51 are injected into the nitride 20' by quantum mechanical tunneling effects to change the stored charge 32' from net negative to net positive. resulting in a negative shift in the threshold voltage of the transistor. In this example. there is no special significance to the choice of +3 and −7 volts to create the 10 volt bias, except that the +3 can be supplied by $V_{cc}$ and the −7 can be generated on chip from a voltage pump.

Figure 4:
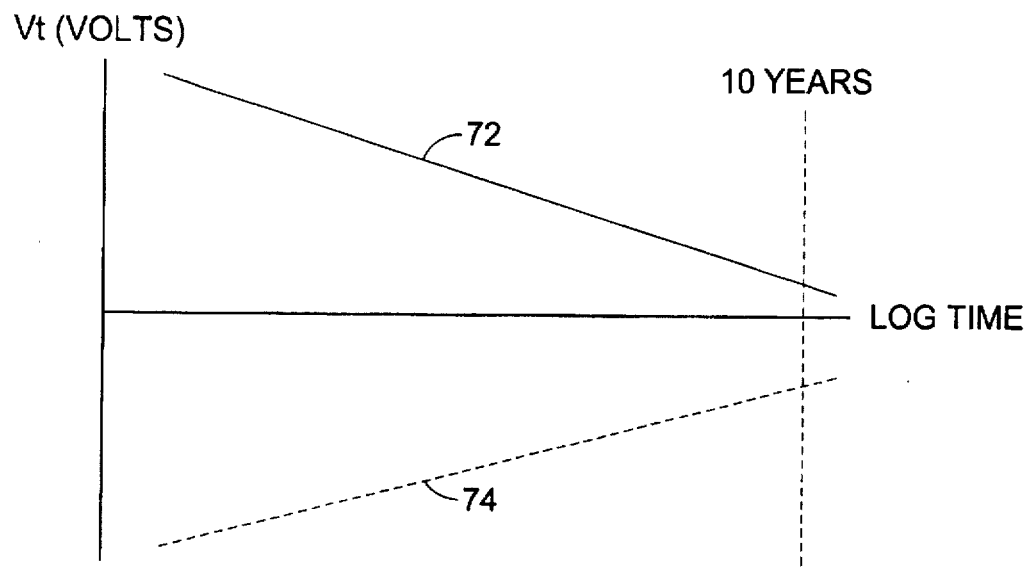
FIG. 4 is a graph is a threshold voltage as a function of decades of time of a timer transistor based on a SNOS or SONOS structure. according to a preferred embodiment of the invention.

Charge stored in a SNOS or SONOS transistor is known to slowly decay such that the threshold voltage of the transistor decays linearly with log time. Such relationship is shown schematically in FIG. 4. The top curve 72 shows the threshold voltage starting positive and decaying to less positive values. This is the expected behavior when there is a net negative charge trapped in the nitride of the gate dielectric. The bottom curve 74 shows the threshold voltage starting negative and decaying to a less negative value, as would be expected when a net positive charge is trapped. Positive charge can be injected into the nitride using the polarity of biases shown in FIG. 3. In these cases the threshold voltage can be measured simply as the gate to source voltage at which a desired drain to source current is achieved.

Figure 5:
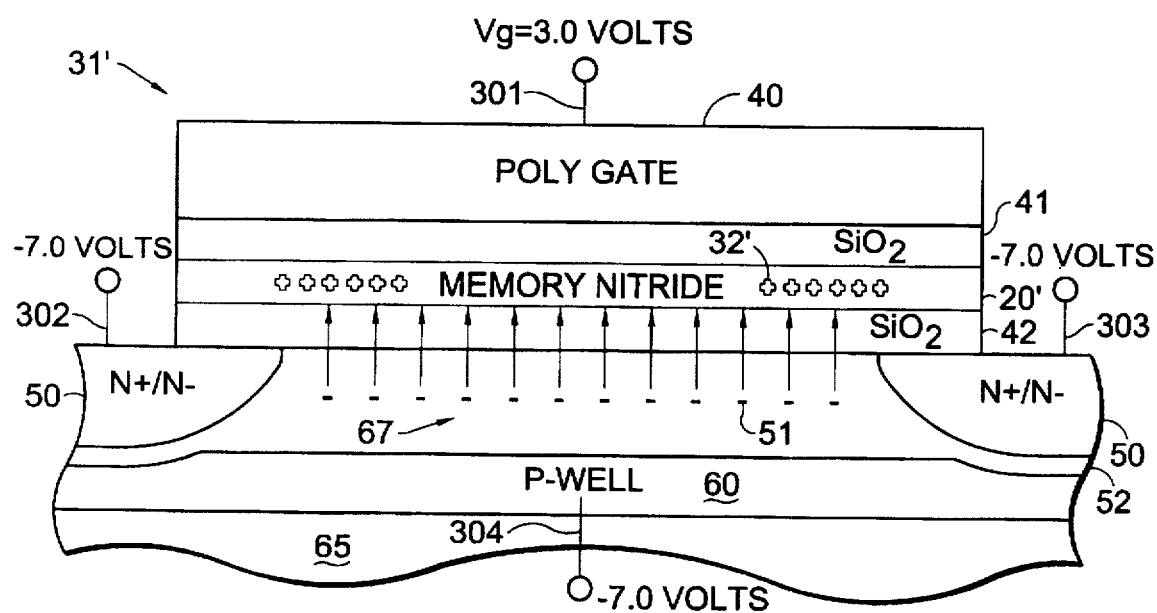
FIG. 5 is a structural representation of a SONOS device embodiment of a dielectric timing element under bias for injecting negative charge into the memory dielectric storage material. according to a preferred embodiment of the invention.

To inject negative charge into the nitride, the bias polarity shown in FIG. 5 may be used. In this embodiment, +3 volts may be applied to node 301, which is connected to the gate 40, and −7 volts is applied to nodes 302, 303, and 304, which are connected to the source, drain and p-well components of device 31', respectively. This bias creates a positive field that causes the depletion region 52 to form and negatively charged electrons 51 to invert the surface of the channel. The electrons 51 are injected into the nitride 20' by quantum mechanical tunneling effects to change the stored charge 32' from net positive to net negative, resulting in a positive shift in the threshold voltage of the transistor.

These biases are applied between the gate 40 and nodes 302, 303, and 304 for a period of typically 100 micro seconds to 1 second. The thicknesses of the layers may be as follows. The bottom $SiO_2$ 42 may be between about 10 and 30 Angstroms; the nitride 20' may be between about 30 and 500 Angstroms, and the top oxide 41 may be between about 0 and 100 Angstroms. The voltage is chosen to establish a field across the bottom oxide of approximately 7 to 10 MV/cm. The quantum mechanical charge injection occurs by direct, Fowler-Nordheim and/or trap assisted tunneling effects.

Figure 6:
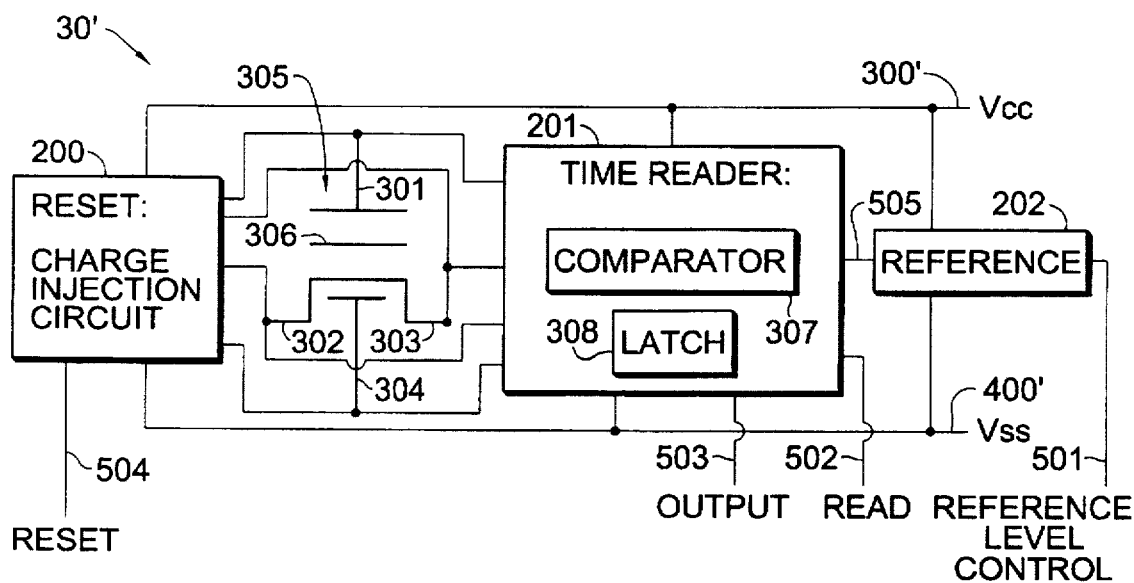
FIG. 6 is an electrical schematic diagram showing an overall circuit arrangement of a timer circuit using a SNOS or SONOS timer transistor. according to a preferred embodiment of the invention.

Referring additionally now to FIG. 6, a timer circuit 30' using an SNOS or SONOS transistor 305 is shown. The gate 301 and the drain and source terminals 302 and 303 of the timer transistor 305 are connected to a charge injection reset circuit 200 and to a time reader and comparator latch 201.

The reset and charge injection circuit 200 includes a reset controller circuit 250 which receives a initiating reset signal on a reset line 504. The reset controller then generates a number of output signals on lines 252 to control the mode of operation of the timer circuit. A −7.0 volt pump circuit 254 is provided to generate an output current on an output line denoted "pumpout" 256, to the timer device 305. To enable the timer device 305 to accept the charge from the pump circuit 254 to be erased, the drain, source, and substrate are each connected to $V_{cc}$ by switch transistors 258 and the pump output on line 256 is connected to the gate via line 301. It should be noted that the quantity of charge that is injected into the dielectric of the memory device 305 by the charge pump circuit 254 is relatively self-limiting, so, depending upon the application desired, no particular current measuring or regulating circuitry is necessary to begin the discharge point at its reset or initialized state.

The timer transistor 305 is programmed by the reset controller 250 actuating the AND gate 260, the output of which controls transistor switches 262 and 264 to connect the gate of the transistor 305 to $V_{cc}$ and the source, drain, and substrate of the transistor 305 to the output from the charge pump 254. Again, no regulation of the amount of charge to be injected is required, since the charge that will be accepted is essentially self-limiting.

The final state of operation of the timer circuit 305 is its discharge state during which the charge is allowed to discharge from the dielectric of the transistor 305. However, prior to entering into the discharge state, all of the elements of the transistor 305 are connected to $V_{ss}$ by the reset controller 250 activating the AND gate 270. The AND gate 270 activates transistors switches 272 to connect all of the elements of the transistor 305 to $V_{ss}$.

Figure 8:
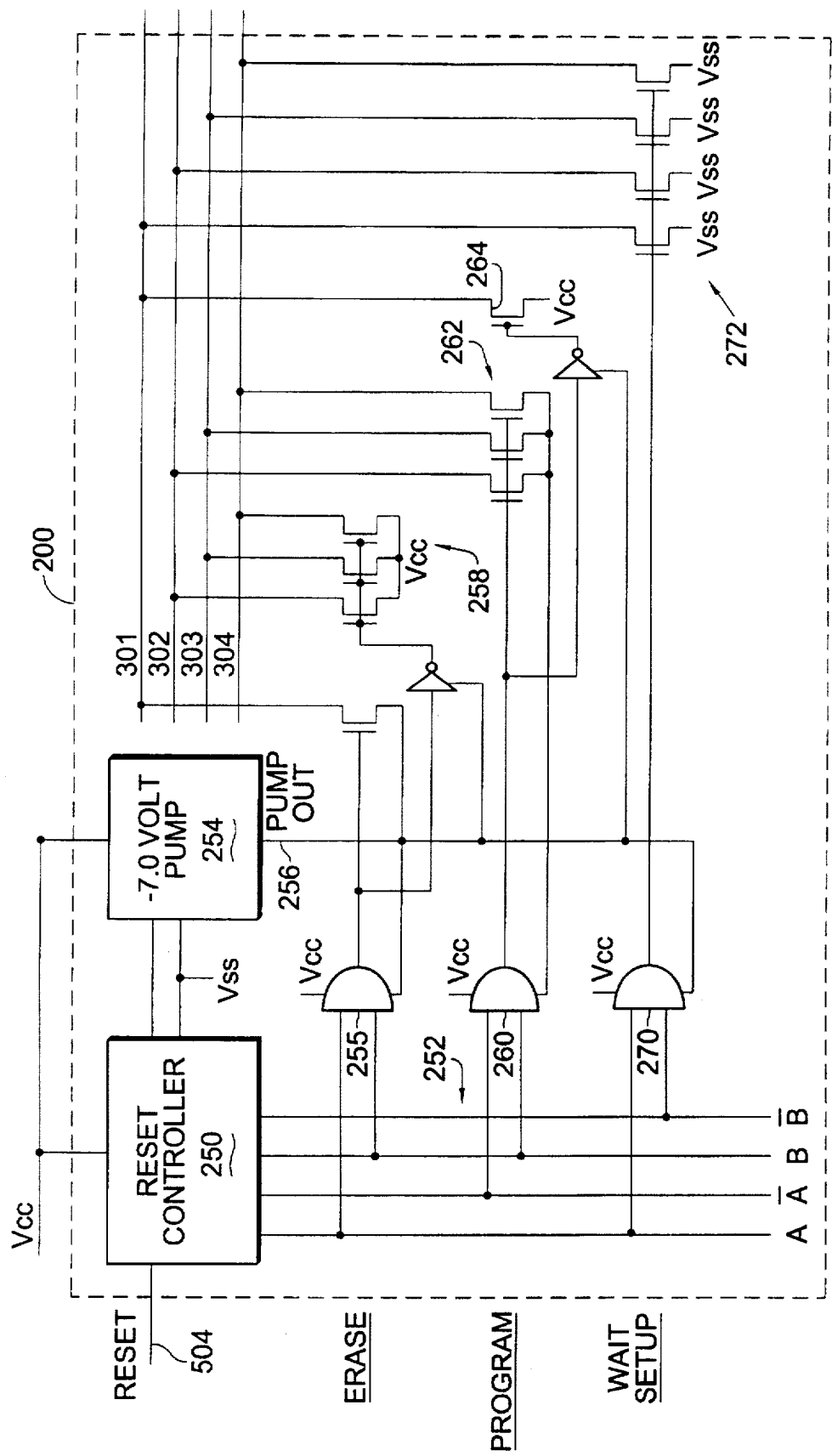
FIG. 8 is an electrical schematic diagram of a reset and charge injection circuit for use in the circuit of FIG. 6.
Figure 9:
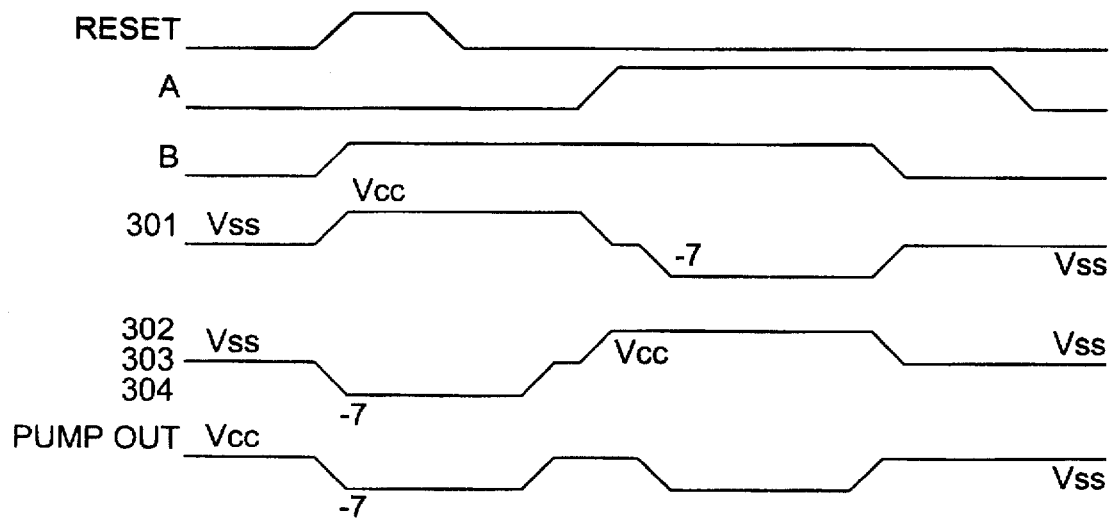
FIG. 9 is are waveforms applied to and generated by a reset controller in the circuit of FIG. 8.

The various wave forms that are produced at various nodes in the circuit 200 of FIG. 8 are shown in FIG. 9.

Figure 10:
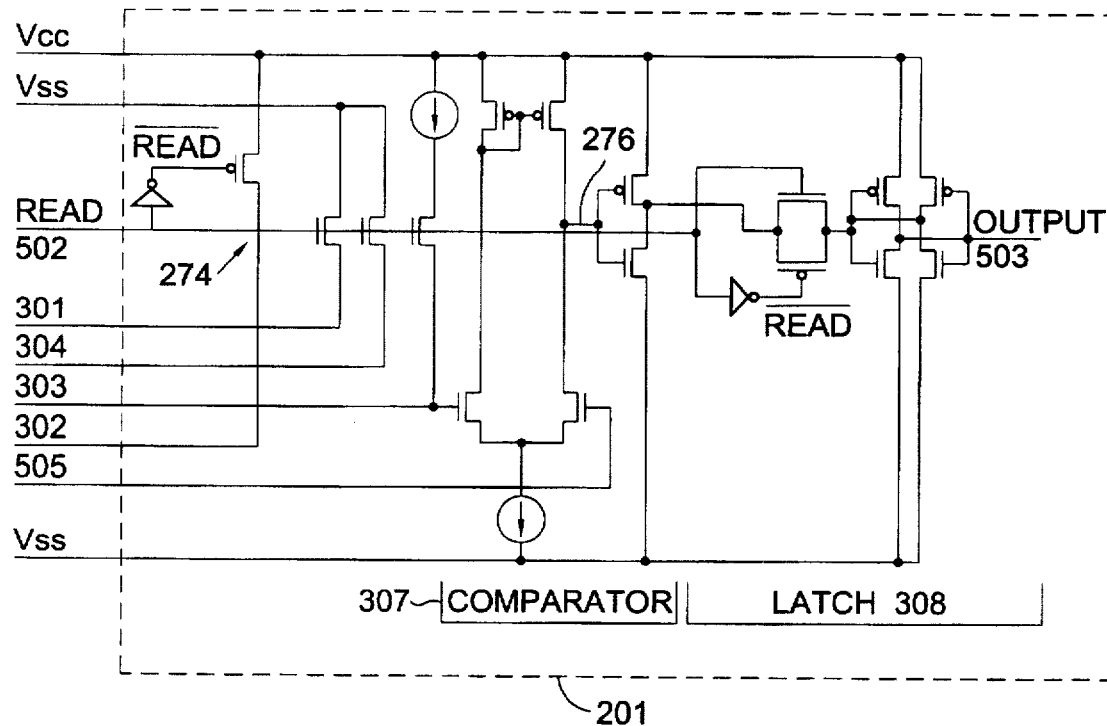
FIG. 10 is an electrical schematic diagram of a timer reader injection circuit for use in the circuit of FIG. 6.

Details of the timer reader circuit 201 are shown in the electrical schematic diagram of FIG. 10. As can be seen, the circuit operation is begun by applying a voltage to the read line 502, which connects the supply voltages by transistors 274 to the respective elements of the timer transistor 305. Thus, the output of the transistor 305 on line 303 is compared with the output from the reference voltage circuit 202 on line 505 in the comparator 307. The value at the output of the comparator 307 on line 276 is latched in the latch circuit 308 and provided on the output line 503, as shown. Thus, the state of the output voltage developed on output line 503 will be high or low depending upon whether the quantity of charge on the dielectric 306 of the timer transistor 305 has discharged to the value that is established by the voltage in the reference circuit 202.

Figure 7:
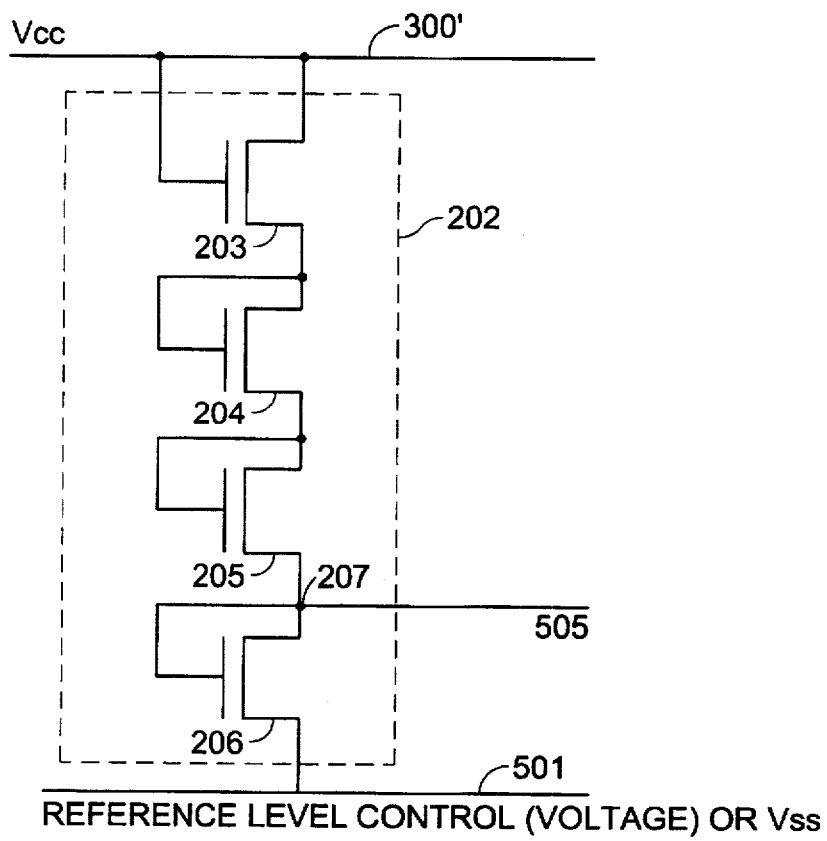
FIG. 7 is an electrical schematic diagram of a reference voltage generator for use in the circuit of FIG. 6.

A reference circuit 202 is provided to the comparator latch circuit 201, as shown. Details of a suitable reference circuit embodiment 202 are shown in FIG. 7. It will be appreciated that other suitable voltage reference circuits can be equally advantageously employed.

With reference now to FIG. 7, the reference circuit 202 includes four FET transistors 203–206 connected in series between the $V_{cc}$ bus 300' and a reference level control voltage on bus 501. The reference level control voltage can be, for example, $V_{ss}$, or may be a selectable reference level control voltage to enable any particular time to be selected. The transistors 203–206 are each configured with their basis connected to their drains. The output voltage is derived from a node 207 on line 505 for connection to the comparator circuit 307 in the time reader 201.

The charge trapped in the nitride of the gate dielectric 306 creates an electric field that modulates the conductance of the transistor channel of the timer transistor 305. Thus, the timer transistor 305 can be constructed using a SNOS or SONOS dielectric as the central timing element. The reset circuit 200, which is powered by power supply levels $V_{cc}$ and $V_{ss}$, connected to lines 300' and 400', respectively, injects charge, either net positive or net negative, into the nitride of the dielectric layer 306, where it is trapped as described above.

The reset circuit 200 is enabled when a reset signal is provided to line 504 while power supply levels $V_{cc}$ and $V_{ss}$ are supplied through lines 300' and 400'. The power can be either removed or maintained once the reset function is complete and the desired charge is trapped in the nitride. When the state of the timer/clock is desired, power supply levels $V_{cc}$ and $V_{ss}$ are provided by way of lines 300' and 400' and a read signal is provided on line 503 to the time read circuit 201. The time read circuit 201 includes a differential comparator circuit 307 that compares a reference current or voltage supplied on line 505 from the reference circuit 202 to either the current flowing through or the voltage developed across the nodes of the timer transistor 305 when biased.

The comparator circuit 307 amplifies the differential toward either $V_{cc}$ or $V_{ss}$, depending on the polarity of the differential established between the reference circuit 202 and the timer transistor 305. The latch circuit 308 latches the amplified differential and provide a voltage on the output line 503. The state of the timer/clock can be determined by measuring the voltage on the output line 503.

More specifically, an example operation sequence that can be performed by circuit 30' includes three steps, a time reset step, a wait or timing step, and a time read step.

During a time reset step, power supply levels $V_{cc}$ and $V_{ss}$ are first supplied to lines 300' and 400', then reset circuit 200 applies the bias conditions shown in FIG. 5 for a first predetermined amount of time to reset the timer transistor 305. Then reset circuit 200 applies the bias conditions shown in FIG. 3 for a second predetermined period of time to start the timer. Finally the reset circuit 200 returns all of the nodes 301, 302, 303, and 304 to the $V_{ss}$ supply level. The reset circuit 200 then disconnects its internal nodes from nodes 301, 302, 303, and 304, leaving timer transistor 305 in a negative threshold voltage state.

The total time to complete all of the parts of this reset step is approximately the sum of the first and second predetermined periods of time and typically falls within 100 microseconds to 1 second.

During the wait or timing step, power supply levels $V_{cc}$ and $V_{ss}$ can be optionally removed to allow the voltage difference between lines 300' and 400' to fall to or near zero. During this period, the charge trapped in the nitride layer of the dielectric will migrate and leave the nitride, regardless of whether power supply levels are applied to lines 300' and 400' or not. The charge migration and loss produces the threshold voltage decay shown in FIG. 4.

When the elapsed time is desired or if the state of the timer is desired, a time read step is executed. Power supply levels $V_{cc}$ and $V_{ss}$ are first supplied to lines 300' and 400'. When time read circuit 201 receives a read request on line 502, the time read circuit 201 applies biases to nodes 301, 302, 303, and 304 to produce a current or voltage on device 305 that is a function of the remaining trapped charge. For example, the time read circuit 201 can be designed to apply supply level $V_{ss}$ to nodes 301 and 302, and $V_{cc}$ to node 304, while supplying a low level current from $V_{cc}$ powered current source to node 303. The current level is preferably 0.1 to 10 microamps times the ratio of the gate width of the timer transistor 305 divided by the gate length of the timer transistor 305. Under this current level, the voltage on line 303 will rise to approximately the magnitude of the threshold voltage of the timer transistor 305 and remain at that level as long as the time read circuit 201 maintains these bias levels.

Alternately, the time read circuit 201 can be designed to apply supply level $V_{ss}$ to nodes 301 and 302, and $V_{cc}$ to node 304, while supplying a voltage level greater than $V_{ss}$ to node 303 to produce current that is a function of the voltage difference between the drain and source, as well as the threshold voltage of the timer transistor 305, according with known transistor current-voltage relationships. Within the time read circuit 201, node 303 is connected to one of two input nodes of the comparator and the other node is connected to the output of reference circuit 202. The output of the reference circuit 202 can be fixed by design of selected by way of reference level control line 501. The comparator produces either a logical high or logical low output depending on the polarity of the difference between the reference 202 output level and the level on node 303. The comparator output is latched within the time read circuit 201 and placed on output line 503 for interrogation.

The circuit 30' can function as a simple timer by providing a fixed level output from the reference circuit 202. Once the comparator circuit 307 senses a change in polarity in the difference between the reference level and the level sensed from the timer transistor 305, the state of the output 503 changes. The level of the reference circuit 202 can be set to a predetermined value that leads to the change in polarity at a desired time. In this way, the output changes state after the chosen amount of time, and remains in the new state until the timer is reset.

The circuit 30' can also function as a clock by varying the level control 501 to the reference circuit 202. The reference level can be changed in an analog fashion until the output 503 changes state. Then the output level from the reference circuit 202 on line 505 at which the output 503 changes state can be equated to a change in time from when the timer transistor 305 was reset. With knowledge of the reset time, a time can be computed.

As an option, power levels $V_{cc}$ and $V_{ss}$ can be supplied to device 305 during all or a portion of the wait or timing step. Additionally, voltages other than $V_{ss}$ can be supplied to nodes 301, 302, 303, and 304 during all or portions of the wait or timing step. Certain voltage combinations have been previously shown to controllably increase or decrease the threshold voltage decay rate in SNOS and SONOS transistors. This allows the timing of the timer circuit 30' to be accelerated or decelerated, while supply levels are present in manner that reacts to environmental conditions without the need to completely reset the timer.

The accuracy of the timer/clock of the circuit 30' is determined by how closely the measured timer transistor 305 parameter follows the linear vs. log time relationship and by how accurately a calibration can be established for a timer/clock unit. The calibration is determined by tracking the timer transistor 305 parameter or the output level of the reference circuit 202 at which the output changes for typically two decades of time, for example, from one second to 100 seconds, to establish the slope of the log time relationship. The high predictability and the linear log nature of the decay allow for easy calibration of the timer/clock in a short period of time.

Although the invention has been described and illustrated with a certain degree or particularity, it is understood that the present disclosure has been make only by way of example, and that numerous changes in the combination and arrangement of parts can be resorted to by those skilled in the art without departing from the spirit and scope of the invention, as hereinafter claimed.

We claim:

1. A semiconductor integrated circuit to determine a passage of time which may include a time during which no electrical power is supplied to said integrated circuit, comprising:

a timing device including a memory storage dielectric for trapping charge carriers and releasing the trapped charge carriers in a known manner over time regardless of whether power is supplied, said timing device having an electrical parameter that is relatable to an electric field created by said trapped charge carriers;

a charge injection circuit for selectively injecting charge carriers into said memory storage dielectric to create an initialized state; and a time reader circuit for determining when said electrical parameter has reached a predetermined value that corresponds to a passage of a predetermined time.

2. The integrated circuit of claim 1 wherein said timing device comprises an insulated gate field effect transistor having a conductive gate, a source, a drain, and a channel, and wherein said memory storage dielectric comprises a dielectric material between the gate and channel overlying at least the channel area.

3. The integrated circuit of claim 2 wherein said transistor is a SONOS transistor.

4. The integrated circuit of claim 2 wherein said transistor is a SNOS transistor.

5. The integrated circuit of claim 2 wherein said charge injection circuit biases the gate, source, and drain of said field effect transistor.

6. The integrated circuit of claim 1 further comprising a reference circuit to provide an electrical reference signal, and wherein said time reader circuit comprises a comparator to measure a difference between said electrical parameter and said electrical reference signal to produce one of two logical results, each of said logical result being uniquely associated with one of two possible polarities of said difference.

7. The integrated circuit of claim 6 wherein said electrical reference signal is a reference voltage.

8. The integrated circuit of claim 6 wherein said electrical reference signal is a reference current.

9. The integrated circuit of claim 6 wherein said reference circuit produces said electrical reference signal at a level that can be externally controlled.

10. The integrated circuit of claim 2 wherein said time reader circuit provides means to connect at least said gate and source to a reference potential.

11. The integrated circuit of claim 10 wherein said reference potential is a power supply reference potential.

12. The integrated circuit of claim 6 wherein said time reader circuit comprises a latch that can produce and store a logical value that indicates a change in the polarity in said difference.

13. The integrated circuit of claim 1 wherein said charge carriers are injected by a quantum mechanical tunneling effect.

14. The integrated circuit of claim 1 wherein said integrated circuit further comprises means to determine a passage of time when electrical power is supplied to said integrated circuit during at least portions of the period of time being recorded.

15. The integrated circuit according to claim 14 where said timing device can be electrically biased to accelerate the release rate of said trapped charge from said memory storage dielectric.

16. The integrated circuit of claim 14 wherein said timing device can be electrically biased to decelerate the release rate of said trapped charge from said memory storage dielectric.

17. The integrated circuit of claim 1 wherein said integrated circuit is embedded in a device which includes other circuits that perform unrelated functions.

18. The integrated circuit of claim 17 wherein said charge injection circuit supplies biases to at least a portion of said other circuits.

19. A method for determining a passage of time which may include a time during which no electrical power is supplied to an integrated circuit containing a timer circuit, comprising:

injecting a predetermined amount of charge carriers into a memory storage dielectric of the type that traps charge carriers and releases the trapped charge carriers in a known manner over time;

providing a timing device which has an electrical parameter that is relatable to an electric field created by said trapped charge carriers;

and determining when said electrical parameter has reached a predetermined value that corresponds to a passage of a predetermined time.

20. The method of claim 19 wherein said step of providing a timing device which has an electrical parameter that is relatable to an electric field created by said trapped charge carriers comprises providing an insulated gate field effect transistor having a conductive gate, a source, a drain, and a channel.

21. The method of claim 19 wherein said step of injecting a predetermined amount of charge carriers into a memory storage dielectric comprises injecting said charge carriers into a SONOS dielectric layer.

22. The method of claim 19 wherein said step of injecting a predetermined amount of charge carriers into a memory storage dielectric comprises injecting said charge cariers into a SNOS dielectric layer.

* * * * *